(12) United States Patent
Vartiainen et al.

(10) Patent No.: US 10,786,829 B2
(45) Date of Patent: Sep. 29, 2020

(54) METHOD FOR IMPROVING THE WATER TOLERANCE OF BIO-BASED CNF-FILMS

(71) Applicant: Teknologian tutkimuskeskus VTT Oy, Espoo (FI)

(72) Inventors: Jari Vartiainen, Espoo (FI); Tero Malm, Espoo (FI); Vesa Kunnari, Espoo (FI); Tuomas Hänninen, Espoo (FI); Tekla Tammelin, Espoo (FI); Maria Soledad Peresin, Espoo (FI); Monika Österberg, Espoo (FI); Leena-Sisko Johansson, Espoo (FI)

(73) Assignee: Teknologian tutkimuskeskus VTT Oy, Espoo (FI)

( * ) Notice: Subject to any disclaimer, the term of this patent is extended or adjusted under 35 U.S.C. 154(b) by 198 days.

(21) Appl. No.: 15/528,522

(22) PCT Filed: Nov. 30, 2015

(86) PCT No.: PCT/FI2015/050835
§ 371 (c)(1),
(2) Date: May 22, 2017

(87) PCT Pub. No.: WO2016/083674
PCT Pub. Date: Jun. 2, 2016

(65) Prior Publication Data
US 2017/0266693 A1    Sep. 21, 2017

(30) Foreign Application Priority Data
Nov. 28, 2014  (FI) ..................................... 20146044

(51) Int. Cl.
*B05D 3/14* (2006.01)
*C08J 5/18* (2006.01)
(Continued)

(52) U.S. Cl.
CPC .............. *B05D 3/148* (2013.01); *B05D 1/30* (2013.01); *C08J 5/18* (2013.01); *C08J 7/065* (2013.01);
(Continued)

(58) Field of Classification Search
CPC ....... C08J 5/18; C08J 7/065; C08J 7/12; C08J 7/123; C09D 101/02; B05D 3/148; B05D 1/30
See application file for complete search history.

(56) References Cited

U.S. PATENT DOCUMENTS

| 7,288,311 | B2 * | 10/2007 | Kawashima | ............ C23C 16/30 |
|---|---|---|---|---|
| | | | | 428/212 |
| 8,236,379 | B2 * | 8/2012 | Kobrin | ..................... B05D 1/60 |
| | | | | 427/180 |

(Continued)

FOREIGN PATENT DOCUMENTS

| EP | 3025857 A1 | 6/2016 |
|---|---|---|
| JP | 2011073174 A * | 4/2011 |

(Continued)

OTHER PUBLICATIONS

JP-2011073174-A Machine Translation (Year: 2011).*

(Continued)

*Primary Examiner* — Michael P Wieczorek
(74) *Attorney, Agent, or Firm* — Laine IP Oy

(57) ABSTRACT

The present invention relates to a continuous roll-to-roll process for improving the water tolerance of bio-based polymers, in particular cellulose nanofibrils (CNF) films. Furthermore, the invention provides a method, which combines surface modification/functionalization for improving water stability and wet strength, UV/Ozone treatment, (Continued)

corona treatment or plasma activation for purifying and activating the surface and thus increasing the reaction efficiency, and further hydrophobization of the surface of CNF film.

13 Claims, 3 Drawing Sheets

(51) Int. Cl.

| | |
|---|---|
| *C08J 7/06* | (2006.01) |
| *C08J 7/12* | (2006.01) |
| *B05D 1/30* | (2006.01) |
| *D21H 11/18* | (2006.01) |
| *D21H 25/04* | (2006.01) |
| *C09D 101/02* | (2006.01) |
| *C23C 16/02* | (2006.01) |
| *C23C 16/40* | (2006.01) |
| *C23C 16/455* | (2006.01) |
| *C23C 18/12* | (2006.01) |

(52) U.S. Cl.
CPC ............... *C08J 7/12* (2013.01); *C08J 7/123* (2013.01); *C09D 101/02* (2013.01); *C23C 16/0272* (2013.01); *C23C 16/403* (2013.01); *C23C 16/45553* (2013.01); *C23C 18/1254* (2013.01); *D21H 11/18* (2013.01); *D21H 25/04* (2013.01); *C08J 2301/02* (2013.01)

(56) References Cited

U.S. PATENT DOCUMENTS

| | | | |
|---|---|---|---|
| 2012/0000392 A1* | 1/2012 | Mukai | ............... C08B 15/02 106/163.01 |
| 2012/0097352 A1* | 4/2012 | Rasanen | ............... C08B 3/14 162/157.6 |
| 2013/0004687 A1 | 1/2013 | Oomori et al. | |
| 2014/0130710 A1* | 5/2014 | Laukkanen | ............ D21H 19/34 106/203.3 |
| 2014/0206798 A1* | 7/2014 | Oomori | ................... C08B 15/04 524/35 |
| 2014/0234640 A1 | 8/2014 | Kohno et al. | |

FOREIGN PATENT DOCUMENTS

| | | | |
|---|---|---|---|
| JP | 5515312 B2 | 6/2014 | |
| WO | WO 2010037906 A1 | 4/2010 | |
| WO | WO 2012107643 A2 | 8/2012 | |
| WO | WO-2013060934 A2 * | 5/2013 | ............... C08J 5/18 |
| WO | WO 2013060934 A2 | 5/2013 | |
| WO | WO 2015011899 A1 | 1/2015 | |

OTHER PUBLICATIONS

Tammelin, et al; Clean and reactive nanostructured cellulose surface' Cellulose, 2013, vol. 20, pp. 983-990 (Year: 2013).*

Hirvikorpi et al: Thin Al2O3 barrier coatings grown on bio-based packaging materials by atomic layer deposition. VTT Publications 770, 2011, pp. 1-81.

Kostamo et al: Picosun revolutionizes roll-to-roll ALD technology. Picosun Oy, Nov. 19, 2012, pp. 1-2.

Johansson, L.-S. et al: "Experimental evidence on medium driven cellulose surface adaptation demonstrated using nanofibrillated cellulose", Soft Matter, 2011, vol. 7, pp. 10917-10924.

Solala, I. et al: "Mechanoradical formation and its effects on birch kraft pulp during the preparation of nanofibrillated cellulose with Masuko refining", Holzforschung 66(4), 2011, pp. 477-483.

Tammelin, T. et al: "Clean and reactive nanostructured cellulose surface", Cellulose, 2013, vol. 20, pp. 983-990.

Aulin, C. et al: "Aerogels from nanofibrillated cellulose with tunable oleophobicity", Soft Matter, 2010, vol. 6., pp. 3298-3305.

\* cited by examiner

|  | 0% RH | 50% RH | 80% RH |
|---|---|---|---|
| Nanocellulose film | <0.1 | 1.5 | 50 |
| Plasticized nanocellulose film | 0.3 | 150 | 1500 |
| ALD-coated nanocellulose film | <0.1 | 0.1 | 10 |

METHOD FOR IMPROVING THE WATER TOLERANCE OF BIO-BASED CNF-FILMS

FIELD OF THE INVENTION

The present invention relates to a new concept for improving the water tolerance of bio-based cellulose nanofibrils (CNF) films. More precisely, the present invention relates to a roll-to-roll process, which combines CNF film production, water stability and wet strength improvement and further surface hydrophobization of such films. Further, the invention concerns the film structures obtained with such method.

DESCRIPTION OF RELATED ART

Cellulose is a natural polymer and almost unlimited source for sustainable production of materials on an industrial scale. Recently, the interest for nano-scaled cellulosic materials, such as cellulose nanofibrils (CNF), also referred to as nanofibrillated cellulose (NFC), and cellulose nanowhiskers (CNC), has increased. The main reasons for the growing interest in nanocellulose are the development of energy efficient and up-scalable production methods and the extraordinary properties of this renewable material.

Micro- or nanofibrillated cellulose can be obtained by mechanical disintegration of cellulosic material using grinding or high-pressure homogenization, such as fluidization. The high aspect ratio of cellulose nanofibrils and its inherent superior high surface area provide this material with an enhanced hydrogen-bonding capability when compared to native fibers, promoting gel-like structure at low solid content values in suspension, as well as strong film formation and high barrier properties when dried.

Additionally, side hydroxyl groups are readily available for surface modification, increasing the already broad spectrum of CNF by overcoming compatibility issues and facilitating the use as replacements of traditional synthetic polymers.

The use of CNF in films production presents several advantages which make them a striking alternative for petroleum-based materials for applications such as packaging for food. Nowadays, feasible technologies have been developed for the manufacture of self-standing films in large. CNF films present low oxygen permeability, grease resistance and they are transparent or translucent plastic-like. However, in such applications, the natural affinity towards water of CNF is a major disadvantage, particularly when the materials need to maintain their performance at various ambient conditions. Several attempts had been reported in order to modify the affinity of individual nanocellulose fibrils towards water, by using different approaches such as surfactant and polyelectrolytes coatings, chemical polymer grafting onto—and from—of cellulose nanofibrils, as well as other methods such as acetylation and silylation.

One of the major drawbacks on surface modifications is that they require non-polar organic solvents as a reaction media, which calls for solvent exchange of the suspensions prior to the reaction. Even though effective, this practice is not only time consuming, but after surface modification, nanocellulose hydrogen-bonding capability is reduced together with its film formation ability, which is an undesirable outcome in the case of films intended for many applications. If the ultimate purpose of the modification is to provide the film with resistance against water in both, liquid and vapour form, it might be preferable to directly modify the surface of nanofibrillated cellulose films instead of single fibrils. Successful modifications on assembled films were reported using different approaches like gas phase reaction, adsorption of CTAB, coating with wax, or alkyl ketene dimer (AKD) in all cases improving the dimensional stability of the films in water.

A very well-known challenge on surface modification of nanocellulose is the substrate tendency to accumulate a passivation layer whenever exposed to nonpolar media. This fact challenges any modification or application based on interactions with the hydroxyl groups of cellulose, via occupying significant part of these groups so that they are no longer available for further functionalization. Thus, an effective activation of the surface prior to modification is essential when such modification is performed in dry state or non-polar media.

Bio-based polymers (including cellulose nanofibrils, CNF) are very hydrophilic and thus sensitive towards moisture. CNF films tend to absorb water, which induces swelling and poor dimensional stability and barrier properties. Technical properties are dependent on the moisture concentration and potential industrial applications are very limited unless CNF films are properly protected from moisture.

Most of the conventional solutions are difficult to up-scale and require relatively complex chemistry, equipment and high coating thickness. For example wax-coatings have been heat-pressed onto surface of CNF films and also multilayered structures have been produced by layer-by-layer dip coating. Both methods are slow batch processes and include time consuming filtration step for producing CNF support film.

WO 2013/060934 describes an industrial scale method of preparing a film of nanofibrillated cellulose having a smooth surface and being essentially translucent or transparent. However, the films obtained are sensitive towards moisture. Thus, there is a need for an up-scalable industrial method for improving the water tolerance of CNF films.

SUMMARY OF THE INVENTION

It is an object of the present invention to improve water tolerance of bio-based CNF films.

Particularly, it is an object of the present invention to improve the water tolerance of bio-based CNF films by combining the following steps:
1) adding polymer compositions to a CNF suspension to improve water stability and wet strength of the CNF suspension,
2) UV/Ozone treatment, corona treatment or plasma activation to improve reaction efficiency of a CNF film and
3) modification of the CNF film surface by plasma deposition, atomic layer deposition
    (ALD) and/or sol-gel method.

These and other objects, together with the advantages thereof over known films, coated supports and methods, are achieved by the present invention, as hereinafter described and claimed.

The method according to the present invention is mainly characterized by what is stated in the characterizing part of claim 1. Furthermore, the CNF film structure according to the invention is characterized in claim 11.

The present invention provides easily up-scalable means for improving the water tolerance properties of CNF films by utilizing roll-to-roll technology. In addition to the scalability, another advantage of the present invention is a preferably continuous process which is able to overcome at least part of the drawbacks of conventional batch processes, which are generally very slow. In addition to water tolerance, also other functionalities may be introduced into the CNF films by means herein described, thus resulting in excellent technical film properties.

Next, the present technology will be described more closely with the aid of to the appended drawings and with reference to a detailed description.

DETAILED DESCRIPTION OF EMBODIMENTS

Figure 1:
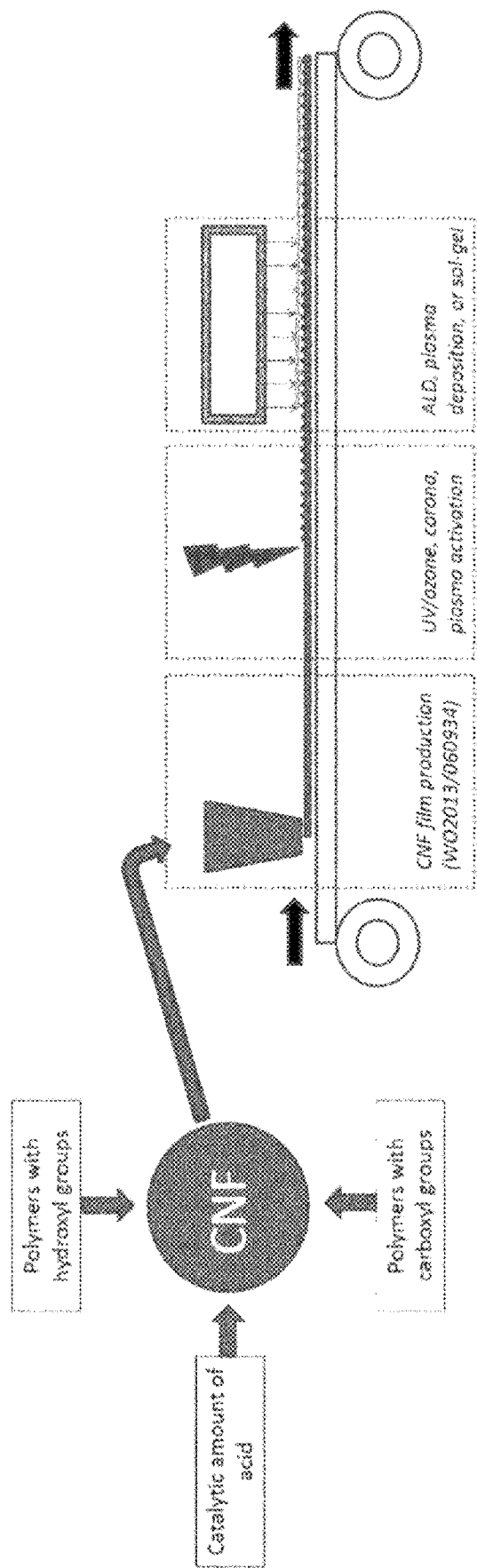
FIG. 1 is a simplified process chart disclosing an embodiment of the present invention.

The present invention relates to a process for producing CNF films of high quality and excellent technical properties in an industrial scale.

Particularly, the present invention relates to a process, which combines plurality of unit operations for improving the water tolerance of CNF films. Such unit operations include preparing a CNF suspension with modifying substances, applying and spreading the suspension on at least one surface of a support material to form a film, treating the film surface for example with UV/Ozone and further modifying the film surface by for example plasma deposition, atomic layer deposition or sol-gel method.

Herein, "cellulose nanofibrils, CNF" are considered as very thin (around 20 nm) fibrils having a longitude of several μm.

Preferably, such a nanofibrillated cellulose is used, which can be dispersed into water or another solvent wherein the CNF forms a gel-like transparent material, which can be used for producing biodegradable and environmentally safe, homogenous and dense films. CNFs of the present invention are particularly unmodified. Thus, the CNF is preferably selected from those types having a film forming ability.

According to one embodiment of the invention, the CNF suspension is applied on a support made of plastic material. The material is preferably selected from the group of polyolefins, such as polyethylene or polypropylene. The support is especially selected from materials of low porosity to prevent the filtration of the CNF suspension. The materials used herein are suitable for roll-to-roll type continuous processes.

Both the nanofibrillated cellulose and the support material may be chemically modified, prior to the formation of the CNF film, by adding polymers containing charged, hydrophobic or polar functional groups, preferably selected from functional groups containing one or more O, S or N atoms or one or more double bonds, most suitably selected from hydroxyl and carboxyl groups.

As far as water tolerance is concerned, the CNF films can be made stable in water by using a simple esterification reaction. Depending on the CNF grade, by adding small amount of polymers containing hydroxyl groups (e.g. polyvinyl alcohol) or carboxyl groups (e.g. polyacrylic acid) and catalytic amount of acid to CNF suspension, the films can be made stable in water yielding improved film wet strength, which is one object of the invention.

According to one embodiment the chemical modification of the CNF suspension is carried out by adding hydroxyl groups or carboxyl groups, preferably selected from polyvinyl alcohol, polyacrylic acids and polycarboxylic acids, and a catalytic amount of acidic salts, such as ammonium chloride, ammonium sulfate, aluminum chloride, magnesium chloride, magnesium nitrate, or alkali metal salts of phosphorous-containing acids.

According to another embodiment, prior to the surface functionalization the CNF film surface is purified and activated with UV/Ozone treatment in order to improve the reaction efficiency, for example by making the surface more receptive to OH-groups. This step also eases up the following process steps. Other suitable purification/activation methods are corona treatment and plasma activation with nitrogen, helium or argon.

According to another embodiment of the invention, films can be further surface hydrophobized by roll-to-roll plasma deposition or by some other suitable technique such as inorganic atomic layer deposition (ALD) with $Al_2O_3$, ZnO, or $TiO_2$. In the case of plasma deposition, a plasma unit is preferably installed in a film coating line. In the unit, deposition precursor chemicals are atomized prior to plasma equipment (see e.g. FIG. 1). Vaporized (atomized) chemicals are then carried into the receptive surface of the CNF film where they react. Different gases, such as nitrogen, helium or argon, may be used as the carrier gas for deposition chemicals and for plasma.

One possible option is to use hydrophobic HMDSO (hexamethyldisiloxane) deposition. In an embodiment, line speeds of from 1 to 100 m/min were used, and the gas feed for precursor was between 0.5 L/min and 6 L/min.

With the concept of the present invention, which may involve simple silylation reaction, also other functionalities can be introduced on CNF film surface, for example amine groups by using other precursors such as acetonitrile, allyl alcohol or 2-hydroxyethyl acrylate.

Furthermore, the hydrophobicity of CNF films may also be increased by adding hydrophobic additives such as nanoclays (e.g. montmorillonite) or using chemical or physical cross-linking, or with surface treatment, such as grafting and extrusion coating or laminating with synthetic polymers such as polyolefins or using thin coatings such as ceramic or organically modified hybrid materials (sol-gels) or atomic layer deposited (ALD) barrier coatings.

According to one particularly preferred embodiment of the present invention, the method of improving water tolerance of bio based CNF (cellulose nanofibrils) films (having two opposite surfaces) protects both surfaces of the CNF film from moisture and includes the steps of:

a) preparing a CNF suspension and modifying the suspension by adding polymers containing charged, hydrophobic or polar functional groups into the suspension, b) preparing a CNF film by applying and spreading the CNF suspension of step a) directly onto a surface of a plastic support material, c) purifying and activating at least one surface of the prepared CNF film of step b) with UV/Ozone treatment, corona treatment or plasma activation and d) modifying the activated CNF film surface by plasma deposition, atomic layer deposition (ALD) or sol-gel method, or any combination thereof.

According to a further embodiment, the method as described above is continuous and utilizes roll-to-roll technology.

The cellulose nanofibrils are preferably bio-based, i.e. of plant or algae origin, and the CNF suspension contains maximum of 2 wt-%, but preferably between 0.25 and 2 wt-% of such cellulose nanofibers (i.e. CNF) from the total suspension.

The thickness of the dry film of CNF applied onto the support is preferably between 15 and 150 µm. The thickness of the support is not an essential parameter. However, generally the thickness of the used support ranges between 20 and 2000 µm.

The film may be present as a coating on at least one surface of the support, which is preferably made of a plastic material as described above. According to a further embodiment, the film may be used as such, i.e. without the presence of the support.

A structure consisting of a CNF film manufactured by the method as hereinabove described is also in the scope of the present invention. In such structure, the CNF film is present as a coating on at least one surface of a support preferably made of plastic material, more preferably selected from polyethylene, polypropylene or polyethylene terephthalate. It is preferred that in the structure CNF film has a thickness between 15 and 150 µm as stated earlier. As a coating CNF has preferably a thickness between 0.5 and 5 µm.

According to a further embodiment the structure consists of the film of CNF, detached from the support.

The CNF films of the present invention can be applied for example to membranes for water purification, as well as for application of high barrier packaging and printed intelligence including disposable solar cells, biosensors and diagnostics.

Next, the present invention is illustrated by the following non-limiting examples. It should be understood, however, that the embodiments given in the description above and in the examples are for illustrative purposes only, and that various changes and modifications are possible within the scope of the claims.

Example 1

Surface Modification of CNF Films

Nanofibrillated Cellulose and CNF Film Manufacture

Never dried birch pulp was provided by UPM Kymmene and it was used as starting material. The pulp was washed into a sodium form, as described by Solala et al., 2011. Fluidization of the pulp was conducted using a microfluidizer (MicroFluidics Corporation, Westwood, USA). The pulp was passed through the fluidizer six (6) times with a final consistency of approximately 2 wt-% of CNF in water. The film production method is a variation of solvent casting films manufacture and it is based on precise control of adhesion, spreading, drying and pressing of the CNF on a plastic substrate. A defined amount of suspension, in a concentration not higher than 2% of solids is coated on a pre-treated plastic substrate. After evaporation of the excess of solvent by controlled drying, the remaining CNF film is carefully separated from the plastic substrate and calenderer with defined time, pressure and temperature. Finally the film is rolled and ready for further use.

CNF Film Surface Modification

Film surface modification was achieved by functionalization of the surface with either silyl or amine groups of the already assembled film surface. The modification protocol is a slight variation for the already known method to modify nanofibrils in bulk, as described e.g. by Johansson et al., 2011. Films of about 40 mg were submerged in dimethylacetamide (DMA, 99%—Sigma-Aldrich) in a weight ratio 1:10 in a reaction vessel under continue nitrogen (g) flow to evacuate any remaining oxygen. The film was kept in DMA under magnetic agitation until the temperature reached 80° C. Either silylation (Hexamethyldisilazan (HMDS), >99%—Sigma-Aldrich) or amination (3-Aminopropyl)-trimethoxysilan (APTES), 97%—Sigma-Aldrich)

X-Ray Photoelectron Spectroscopy (XPS)

Surface chemical analysis of the self-standing films was studied using X-Ray photoelectron spectroscopy (XPS) with a Kratos Analytical AXIS 165 electron spectrometer with monochromatic Al Ka irradiation at 100K. Details on acquisition parameters are reported in Johansson et al. (Johansson et al., Microchimica Acta 2002). Low resolution survey spectra and high resolution carbon (C 1s) and oxygen (O 1s) were collected from the samples at least 3 locations. Analyzed area was less than 1 mm2 and only the outmost 10 nm of the film were reached by this technique without inducing any degradation on the sample. (Johansson et al., Surface Interface Analysis, 2001) As an in-situ reference, ash-free 100% cellulose filter paper was analyzed. (Johansson et al. Surface Interface Analysis, 2001) Silicon (Si 2p) and Nitrogen (N 1s) were recorded using survey resolution and extended acquisition times. (Johansson et al., Soft Matter 2011)

Solid State Nuclear Magnetic Resonance ($^{13}$C-NMR and $^{29}$Si-NMR)

$^{13}$C CP/MAS NMR measurements were performed at room temperature with a Chemagnetics CMX 270 MHz Infinity NMR spectrometer using a 6.0 mm double-resonance MAS NMR probe operating at 68.01 MHz. The $^{13}$C NMR spectra were acquired with cross polarisation (CP) magic-angle spinning (MAS) sequence with carbon background suppression. For all the samples 30,000 transients were accumulated, using a 1 ms contact time, 3 s recycle time and a spinning speed of 4.5 kHz. The chemical shifts were referenced to hexamethylbenzene (HMB) using the methyl signal (+17.35 ppm) as an external reference. $^{29}$Si CP/MAS NMR measurements were performed with a Chemagnetics CMX 270 MHz Infinity NMR spectrometer using a 6.0 mm double-resonance MAS NMR probe operating at 53.73 MHz. For all the samples 80,000 transients were accumulated, using a 3 ms contact time, 3 s recycle time and a spinning speed of 4.5 kHz. The chemical shifts were referenced to tetrakis(trimethylsilyl)silane TTMSS using SiMe$_3$ (−8.75, and −9.60 ppm) as an external reference.

Morphology and Roughness Assessment—Atomic Force Microscopy (AFM)

Topography and morphology of the CNF films before and after surface modification was studied by using Atomic force microscopy (AFM). AFM was carried out using a Nanoscope IIIa Multimode scanning probe microscope (Digital Instruments Inc., Santa Barbara, Calif., USA) in tapping mode. Images were scanned using silicon cantilevers supplied by µMasch (Tallin, Estonia) with nominal resonance frequencies of 320-360 kHz. Arithmetic and root mean square roughness values were extracted from topographic AFM images (1 µm*2 µm). No additional image processing other than flattening was performed on the images. Each sample was scanned in a minimum of three spots of each sample in order to assure reproducibility.

Contact Angle Measurements (CAM)

Changes in the wettability of the films after chemical modification were studied by CAM through the sessile drop method employing a CAM (KSV Instruments Ltd, Finland) equipped with a video camera and contact angle meter controlled with software. Measurements were determined by Young-Laplace equation approximation of the drop shape. Measurements were performed in at least 5 different sections for each sample.

Oxygen Transmission Rate Measurements

Oxygen transmission measurements were performed with Ox-Tran 2/20 Oxygen Transmission Rate System (Mocon, Modern Controls, Inc., USA) according to ASTM D3985-02. Tests were carried out at 23° C. and varying relative humidity using 100% oxygen as test gas. Aluminium foil masks, with an inner diameter area of 5 $cm^2$, were used to mount film samples in the diffusion cell.

Example 2

UV/Ozone Treatment (Österberg et al., 2013)

Nanofibrillated cellulose (NFC) was prepared by disintegration of fully bleached never-dried hard wood kraft pulp using a high shear Fluidizer (Microfluidics Int. Co, USA). The pulp was washed into sodium form prior to disintegration according to a method introduced by Swerin et al. (1990) and passed six times through the fluidizer. This treatment removes excess of salt from the pulp suspension and ensures that only sodium ions are associated with anionic groups on the pulp. No chemical or enzymatic pre-treatment was applied and the charge density of the pulp was 0.0065 meq/g as determined by conductometric titration according to Katz et al. (1984). The 132 $cm^2$ large and around 100 μm thick free-standing NFC films were prepared by over-pressure filtration of a 0.84% dispersion of fibrils followed by hot pressing at 100° C. and 1,800 Pa (Österberg et al. 2013). Sefar Nitex polyamine fabric was used for filtration and remained with the film during pressing. A commercial UV ozonator from Bioforce Nanosciences was used to activate the NFC film surface. The nominal power of the UV source was 80 W, the intensities of the most important wavelengths were 199 for 185 nm and 3.975 for 254 nm according to the manufacturer. The distance between sample and radiation source was 2.5 cm. Treatment time for the films was 10 min. The sample size was about 2×4 cm.

Efficiency of the activation of the film surface was demonstrated by a simple silylation reaction performed on films obtained in pilot scale, according to Tammelin et al. (2011) and Peresin et al. (2012). The modification protocol is a slight variation of the method used to modify nanofibrils in bulk (Johansson et al. 2011). Films of about 100 mg were submerged in 150 ml Dimethylacetamide (DMA, 99%—Sigma-Aldrich) in a reaction vessel under continuous Nitrogen flow to evacuate any remaining oxygen. The film was kept in DMA under magnetic agitation until the temperature reached 80° C. Hexamethyldisilazan, (>99% purchased from Sigma-Aldrich) was added drop-wise while stirring (1 μl reagent/mg of film). Reaction was continued over night at constant temperature. Films were thoroughly washed with DMA and with methanol (HPLC grade; Rathburn) to remove any possible unreacted chemicals. Finally, the films were allowed to dry in air.

X-Ray Photoelectron Spectroscopy (XPS) (Kratos Analytical AXIS 165 electron spectrometer with monochromatic Al Ka irradiation at 100 W), was used for surface chemical analysis of the free-standing NFC films. More specifically the effect of UV/O3 treatment and silylation on surface chemical composition was monitored. The measurement procedures and acquisition parameters were optimized for cellulosic samples as described by Johansson (2002). Samples were analysed after 1 week storage in desiccator. A minimum of three different areas were measured per sample. Atomic force microscopy (AFM) (Nanoscope IIIa scanning probe instrument from Digital Instruments, Santa Barbara, USA) was used to probe the surface topography of the films before and after $UV/O_3$ treatment. Three different areas on each sample were scanned in tapping mode in air using silicon cantilevers (SCD 15/AIBS, MicroMasch, Tallinn, Estonia). The nominal resonance frequency of the cantilevers was around 300 kHz.

Contact Angle Measurements

The sessile drop method was employed for determination of water CA with a video camera based fully computercontrolled contact angle meter (CAM 200 from KSV Instruments Ltd., Finland). The measurements were performed at room temperature using deionized water further purified through a Milli-Q water purification unit. At least five separate measurements were made for each sample either 15 min or 1 week after $UV/O^3$ treatment. The samples were stored in a desiccator prior to measurements.

Fourier transform infrared spectroscopy (FTIR) was applied to verify that no chemical degradation of the cellulose occur during the UV/ozone treatment. With the BIO-RAD UMA 500 spectrometer (USA) equipped with a universal attenuated total reflection (ATR) germanium crystal the films could be analysed directly without further sample preparation, the analysis depth being about one micrometer. The spectral data was processed with GRAMS AI software (Thermo Scientific, Galactic Industries Corporation, New Hampshire, USA. All spectra were base line corrected and further normalized to have the same value at 1,200 $cm^{-1}$.

Example 3

Chemical Modification with Chemical Vapour Deposition Technique

Thin (25-50 nm) $Al_2O_3$ coatings were deposited at low temperatures of 80 or 100° C. on various biobased CNF, pectin, PHB and PLA films. The depositions were carried out in a Picosun SUNALE™ ALD reactor. Trimethylaluminum (TMA, electronic grade purity, SAFC Hitech) and $H_2O$ were used as precursors. High purity nitrogen (99.9999% $N_2$) was used as a carrier and purge gas. The deposition sequence was 0.1 s TMA pulse, 6 s $N_2$ purge, 0.1 s water pulse and 6 s $N_2$ purge. The operating pressure was 1-2 kPa. The resultant film growth rates were determined to be app. 0.1 nm/cycle on a silicon wafer Si(100). It should be emphasized, however, that because of the different polarities and functional groups of the surfaces of different polymers, the actual growth rates may deviate slightly from that determined for the $Al_2O_3$ coating on a flat silicon wafer.

Characterizations

The oxygen and water vapour barrier properties were determined for all the samples by measuring the oxygen and water vapour transmission rates. The oxygen transmission rate (OTR) was measured from two to three parallel samples using humid gases at 23° C. in 50% relative humidity with a Systech M8001 or Mocon Oxtran 2/20 and expressed as cm3/m2/105 Pa/day. The water vapour transmission rate (WVTR) was measured for three to five parallel samples according to the modified gravimetric methods ISO 2528:

1995 and SCAN P 22:68 and expressed as g/m$^2$/day. The test conditions were 23° C. and 75% relative humidity.

Results

Figures 2, 3:
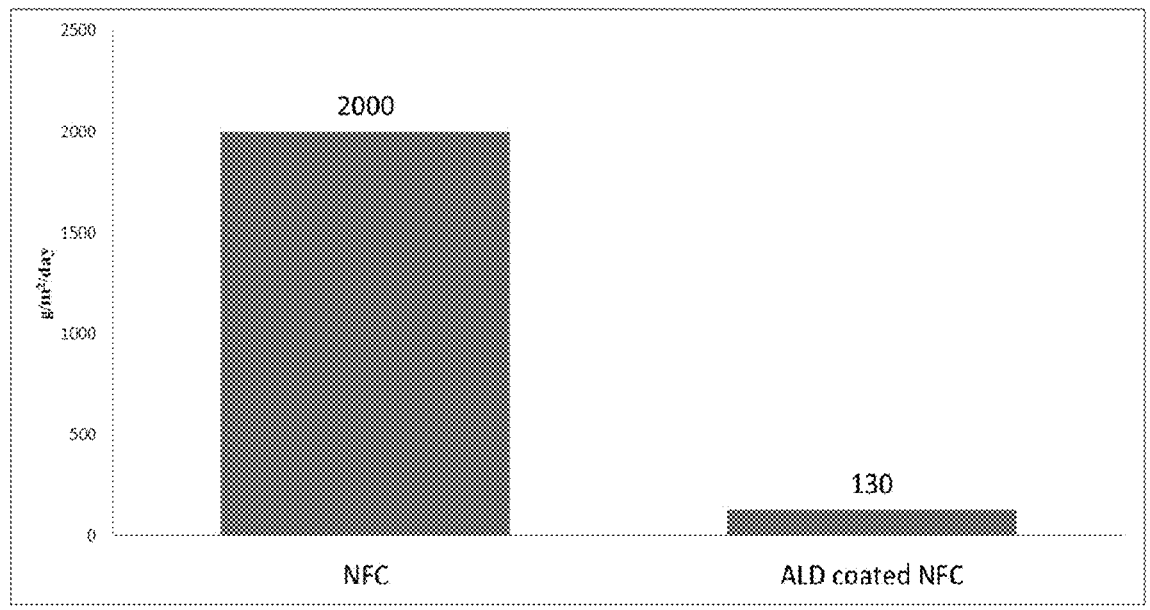
FIG. 2 is a bar chart showing the effect of ALD coating on water vapour transmission rate of CNF films at tropical conditions (38° C., 90% relative humidity).
FIG. 3 is a table showing the oxygen transmission rates of CNF films as measured at different relative humidities (RH) at 23° C. (cc×20 μm/m²/day).

Both oxygen and water vapour barrier improvements were achieved for all bio-based substrates including CNF films with a 25 nm thick Al$_2$O$_3$ layer deposited by the TMA-H$_2$O process (FIG. 2 and FIG. 3). In addition to extremely good oxygen barrier properties, it was noted that nanofibrillated cellulose (NFC) film coated with a 25 nm thick Al$_2$O$_3$ layer formed a highly homogenous layer on top of single fibres. This is believed to form protecting layers for nanofibres. Such materials are of high interest because of the controlled organic fibre and inorganic thin-film material integration. This kind of conformal coating on single fibres opens up new application possibilities in the area of filter development.

Example 4

Plasma Activation and Deposition of CNF Films

CNF films were produced as follows: the dispersion including 30% of sorbitol was first carefully pre-homogenized by mixing with Diaf dissolver for 30 min (300 rpm) and then cast at a line-speed of 5 m/min onto a casting substrate using a specific feeding head. In the feeding head the dispersion formed an even and uniform wet layer. Spreading and adhesion between the substrate and aqueous CNF dispersion were carefully controlled by physical plasma-activation. Atmospheric plasma treatment unit Vetaphone Corona-Plus (Type TF-415, CP1C MKII 2.0 kW) equipped with argon/nitrogen plasma-unit was used to fix the surface energy of the casting substrate.

The films were further treated with HMDSO (hexamethyldisiloxane) plasma-deposition using Plasmaline® atmospheric plasma treatment unit and the following process parameters (P=600 W, N$_2$ flow=2×150 SLM, HMDSO feed 2×1.5 SLM, line speeds 0.5, 5 and 10 m/min).

Water contact angles were measured using CAM200 equipment (KSV Instruments, Finland) in test conditions of 23° C. and 50% relative humidity. Water vapour transmission rates (WVTR) were determined gravimetrically using a modified ASTME-96B (wet cup) procedure. Samples with a test area of 30 cm$^2$ were mounted on a circular aluminium dish (68-3000 Vapometer EZ-Cups), which contained water. Dishes were stored in test conditions of 23° C. and 50% relative humidity and weighed periodically until a constant rate of weight reduction was attained.

Figure 4:
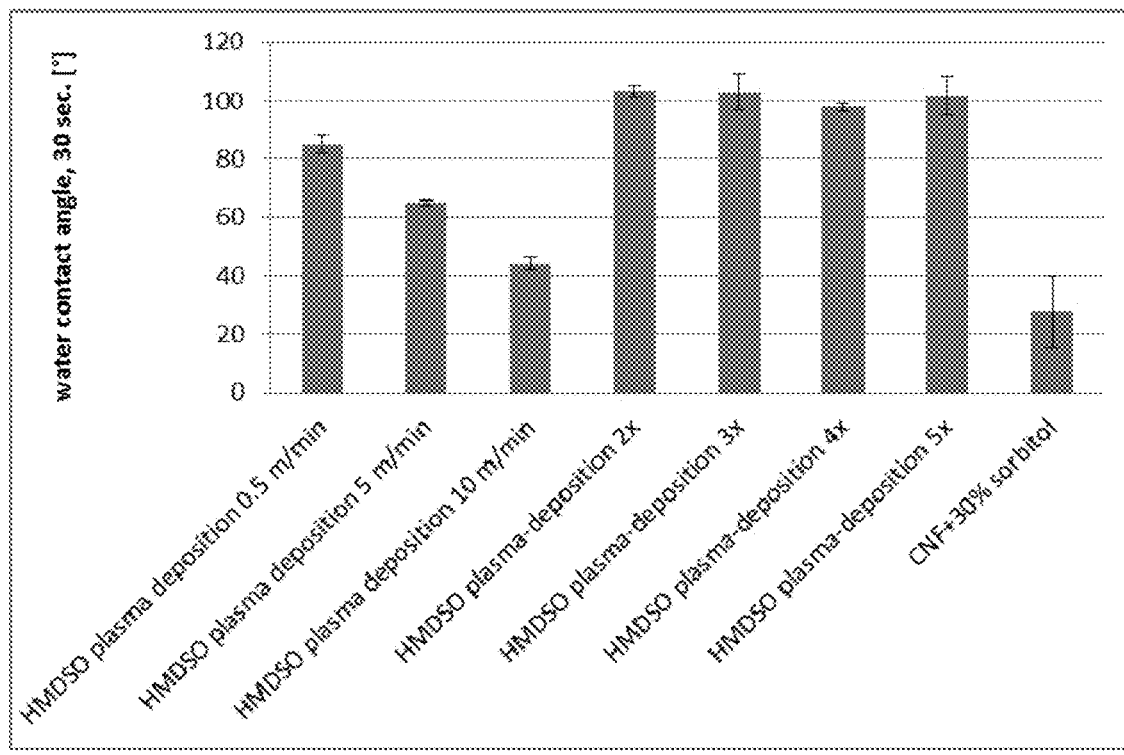
FIG. 4 is a chart showing water contact angles i.e. increase in surface hydrophobicity of HMDSO plasma-deposited CNF films after 30 seconds of droplet deposition.
Figure 5:
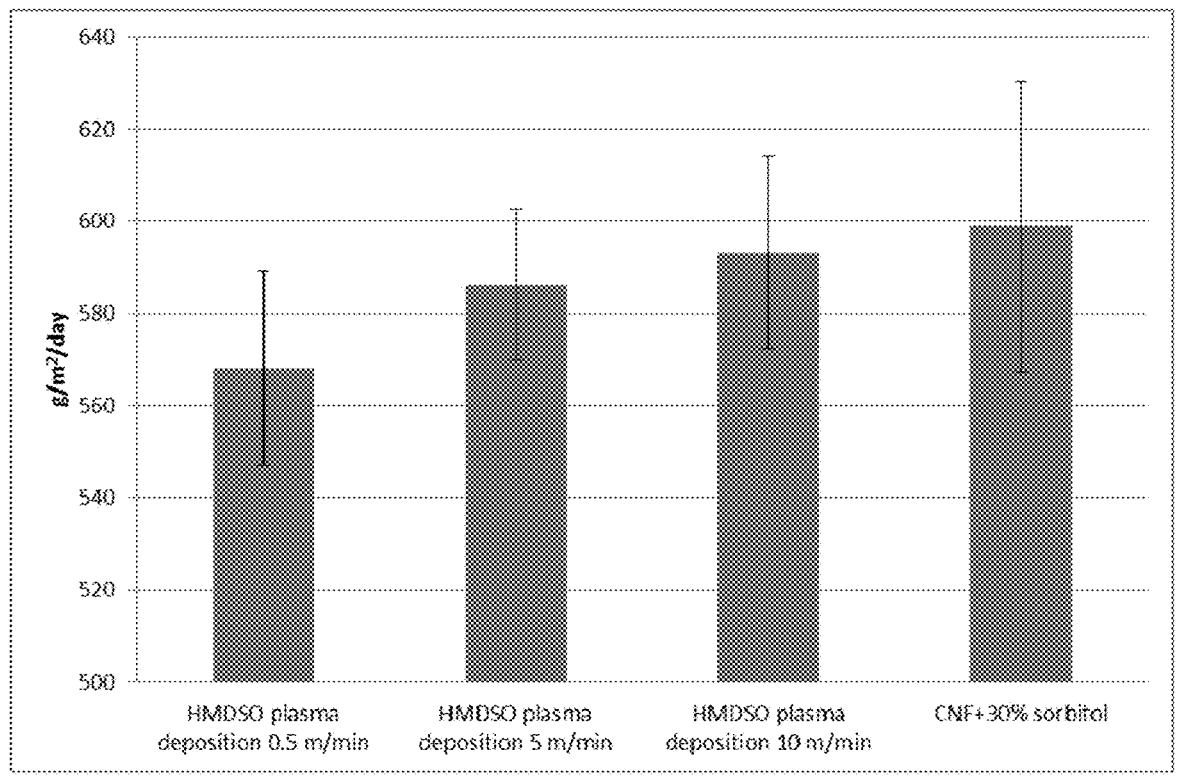
FIG. 5 is a chart showing water vapour transmission rates i.e. increase of water vapour barrier properties of HMDSO plasma-deposited CNF films measured at 23° C., 100/50% relative humidity.

Both surface hydrophobicity (FIG. 4) and water vapour barrier properties (FIG. 5) were increased as a result of HMDSO plasma-deposition.

CITATION LIST

Patent Literature

1. WO 2013/060934

Non-Patent Literature

1. Solala, I., Volperts, A., Andersone, A., Dizhbite, T., Mironova-Ulmane, N., Vehniainen, A., Pere, J., and Vuorinen, T., "Mechanoradical formation and its effects on birch kraft pulp during the preparation of nanofibrillated cellulose with Masuko refining," Holzforschung 66(4), pp. 477-483 (2011).

2. Johansson, L.-S., Tammelin, T., Campbell, J. M., Setala, H., Österberg, M., Experimental evidence on medium driven cellulose surface adaptation demonstrated using nanofibrillated cellulose. Soft Matter 2011, 7, 10917-10924.

3. Österberg, M., Soledad Peresin, M., Johansson, L.-S., Tammelin, T., Clean and reactive nanostructured cellulose surface, Cellulose 2013, 20, pp. 983-990, DOI: 10.1007/s10570-013-9920-8.

The invention claimed is:

1. A method of providing water tolerance to a cellulose nanofibril (CNF) film having two opposite surfaces, the method comprising:
    a) preparing a CNF suspension and modifying the CNF suspension by adding a polymer into the suspension for esterification of the CNF in the suspension, wherein the polymer comprises a member selected from the group consisting of polyvinyl alcohol, a polyacrylic acid, and a polycarboxylic acid,
    b) applying and spreading the CNF suspension directly onto a surface of a plastic support material in order to prepare a CNF film having enhanced wet strength due to the esterification,
    c) purifying and activating at least one surface of the CNF film with UV/Ozone treatment, corona treatment, or plasma activation, and
    d) hydrophobizing the at least one activated surface of the CNF film by plasma deposition, atomic layer deposition (ALD), a sol-gel method, or any combination thereof.

2. The method according to claim 1, wherein the method is continuous and utilizes roll-to-roll technology.

3. The method according to claim 1, wherein the CNF suspension comprises between 0.25 and 2 wt-% of unmodified nanofibrillated cellulose.

4. The method according to claim 1, further comprising a catalytic amount of an acidic salt, or an alkali metal salt of a phosphorous-containing acid during the esterification.

5. The method according to claim 4, wherein the acidic salt comprises a member selected from the group consisting of ammonium chloride, ammonium sulfate, aluminum chloride, magnesium chloride, and magnesium nitrate.

6. The method according to claim 1, wherein the plastic support material comprises a polyolefin.

7. The method according to claim 1, wherein the hydrophobizing is done by plasma deposition, and wherein a plasma unit is installed in a coating line and the plasma unit uses power between 200 W and 800 W.

8. The method according to claim 7, wherein a gas selected from the group consisting of nitrogen, helium, and argon is used as a carrier gas for a deposition chemical and for plasma in the plasma deposition.

9. The method according to claim 7, wherein a deposition chemical(s) is (are) atomized prior to the plasma unit.

10. The method according to claim 9, wherein hexamethyldisiloxane (HMDSO) is used as a deposition chemical.

11. The method according to claim 1, wherein the purifying and activating is done via UV/Ozone treatment.

12. The method according to claim 1, wherein the hydrophobizing is done by atomic layer deposition (ALD) with Al$_2$O$_3$, ZnO, or TiO$_2$.

13. The method of claim 1, wherein the polymer comprises polyvinyl alcohol.

* * * * *